(12) United States Patent
Schrey et al.

(10) Patent No.: US 11,013,106 B1
(45) Date of Patent: May 18, 2021

(54) ELECTRONIC CONTROL UNIT

(71) Applicant: Aptiv Technologies Limited, St. Michael (BB)

(72) Inventors: Moritz Schrey, Wuppertal (DE); Ralf Dittrich, Dusseldorf (DE); Pekka Herzogenrath, Wuppertal (DE)

(73) Assignee: Aptiv Technologies Limited, St. Michael (BB)

( * ) Notice: Subject to any disclaimer, the term of this patent is extended or adjusted under 35 U.S.C. 154(b) by 0 days.

(21) Appl. No.: 17/116,826

(22) Filed: Dec. 9, 2020

(30) Foreign Application Priority Data

Jan. 17, 2020 (EP) .................................... 20152425

(51) Int. Cl.
*H05K 1/11* (2006.01)
*H05K 1/02* (2006.01)
*H05K 3/30* (2006.01)
*H05K 1/14* (2006.01)

(52) U.S. Cl.
CPC ......... *H05K 1/0266* (2013.01); *H05K 1/0286* (2013.01); *H05K 1/11* (2013.01); *H05K 1/142* (2013.01); *H05K 3/303* (2013.01); *H05K 2201/0909* (2013.01); *H05K 2201/09936* (2013.01); *H05K 2201/10159* (2013.01); *H05K 2203/0228* (2013.01)

(58) Field of Classification Search
CPC .......................... H05K 1/11–119; H05K 1/142
See application file for complete search history.

(56) References Cited

U.S. PATENT DOCUMENTS

| 5,920,465 | A | 7/1999 | Tanaka |
| 6,246,933 | B1 | 6/2001 | Bague |
| 8,806,115 | B1 | 8/2014 | Patel et al. |
| 9,160,091 | B2 | 10/2015 | Tsai et al. |
| 9,195,542 | B2 | 11/2015 | McKelvie et al. |
| 9,451,691 | B2 | 9/2016 | Kim et al. |
| 9,946,610 | B2 | 4/2018 | Kinoshita |
| 9,966,678 | B2 | 5/2018 | Chiang et al. |
| 2007/0040365 | A1 | 2/2007 | Asada et al. |
| 2007/0137886 | A1 | 6/2007 | Yen |
| 2008/0278903 | A1 | 11/2008 | Ni et al. |
| 2009/0058995 | A1 | 3/2009 | Yamashita |
| 2010/0170953 | A1 | 7/2010 | Schaade |
| 2014/0026019 | A1 | 1/2014 | Sawada |
| 2017/0018541 | A1 | 1/2017 | Yi et al. |
| 2017/0233000 | A1 | 8/2017 | Fujimoto et al. |

(Continued)

FOREIGN PATENT DOCUMENTS

| CN | 104375959 | 2/2015 |
| DE | 102018202230 | 8/2019 |

(Continued)

OTHER PUBLICATIONS

"Extended European Search Report", EP Application No. 20152425. 6, dated Jul. 23, 2020, 7 pages.

*Primary Examiner* — Jeremy C Norris
(74) *Attorney, Agent, or Firm* — Colby Nipper PLLC

(57) ABSTRACT

An electronic control unit comprises at least one controller and at least one memory device, wherein the controller comprises at least one electronic component mounted on a main circuit board. An embedded circuit board is formed in one piece with the main circuit board, and a predetermined separation line is provided for separating the embedded circuit board from the main circuit board.

20 Claims, 3 Drawing Sheets

(56) References Cited

U.S. PATENT DOCUMENTS

2019/0042414 A1  2/2019  Juenemann et al.
2019/0287319 A1  9/2019  Golov
2019/0302766 A1  10/2019 Mondello et al.

FOREIGN PATENT DOCUMENTS

GB  2126013     3/1984
GB  2497674     6/2013
WO  2004023859  3/2004
WO  2016114755  7/2016

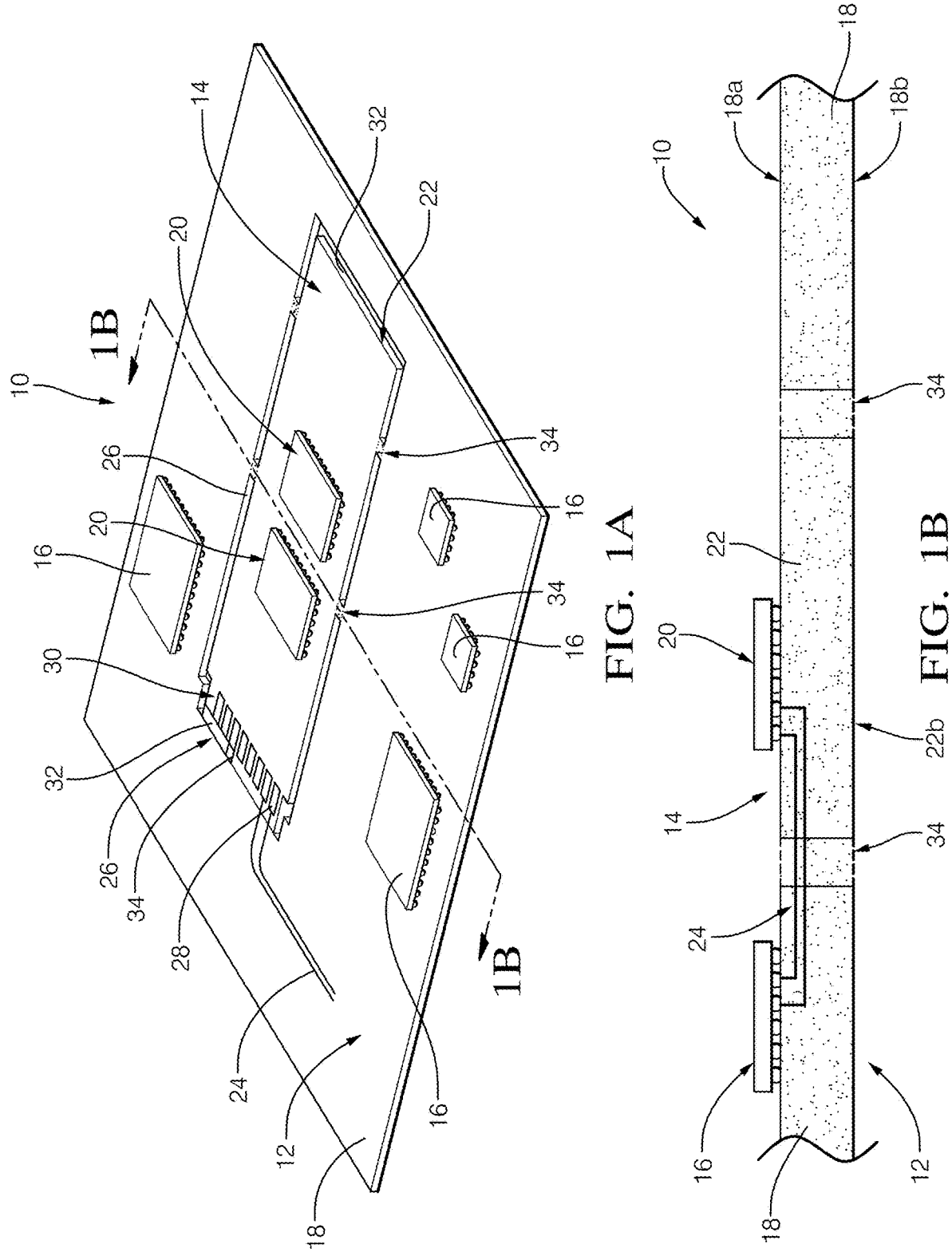

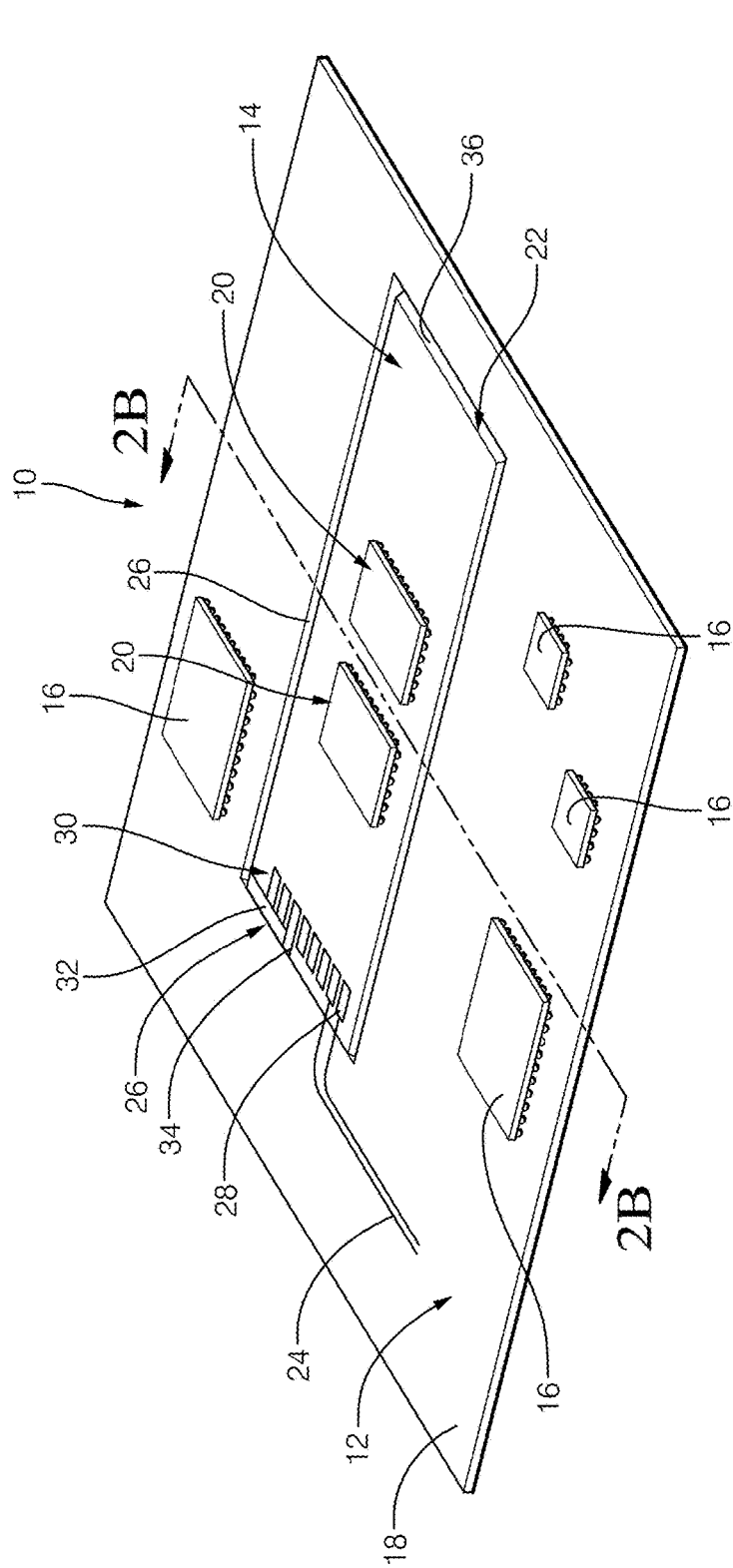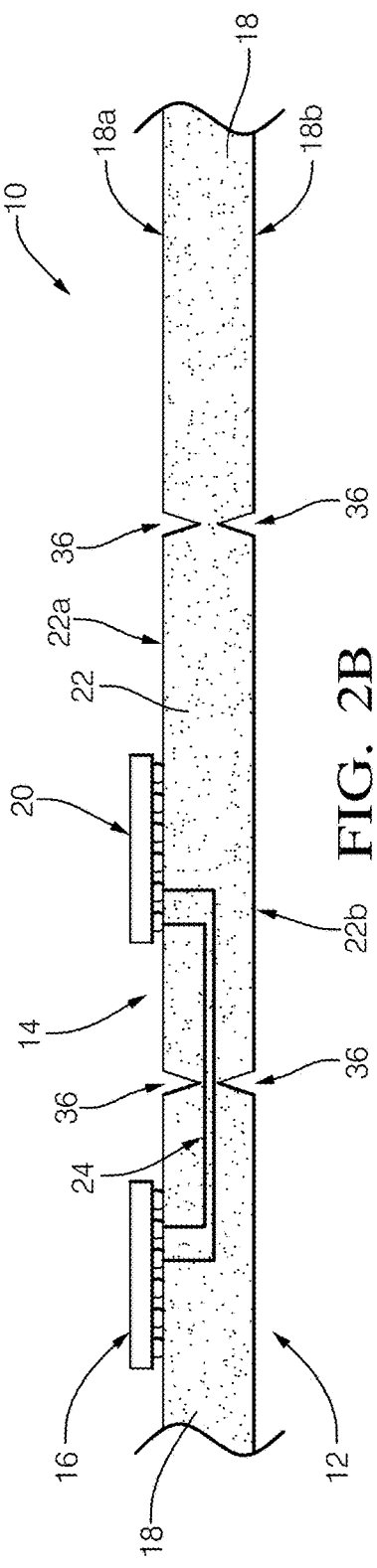

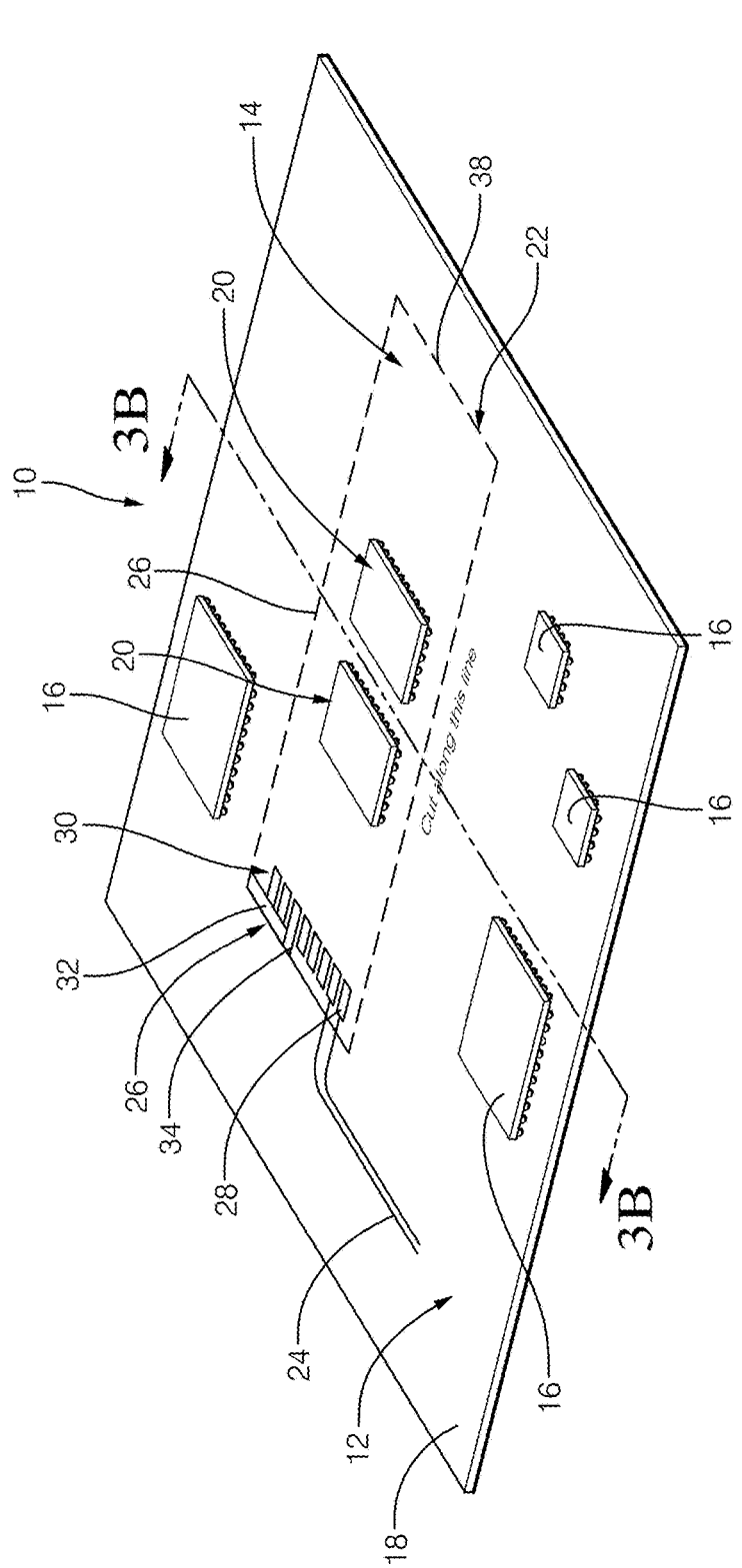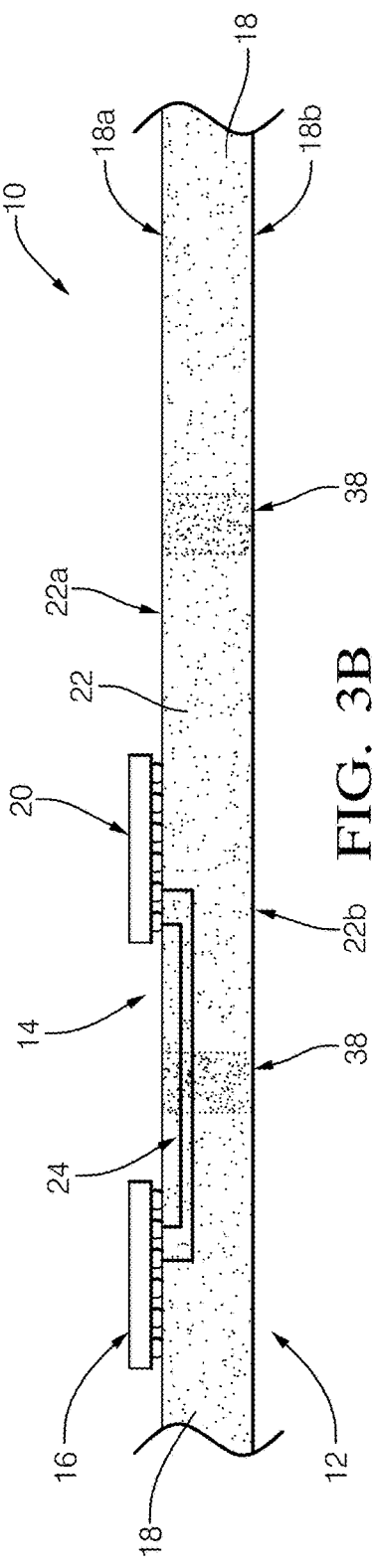

ELECTRONIC CONTROL UNIT

CROSS-REFERENCE TO RELATED APPLICATION

This application claims priority to European Patent Application Number 20152425.3, filed Jan. 17, 2020, the disclosure of which is hereby incorporated by reference in its entirety herein.

TECHNICAL FIELD

The present disclosure relates to an electronic control unit comprising a controller and a memory device.

BACKGROUND

Electronic control units (ECUs) are used in various automotive applications. For storing data of the controller they usually comprise non-volatile memory devices which currently are distributed either as chip package form factor or as module form factor devices.

Memory devices in chip package form factor contain all necessary electronics to access data which has previously been stored in this device. Said memory devices are commonly soldered to a printed circuit board (PCB) of the ECU, thereby being permanently affixed to it. Thereby, all connections between the memory device chip package are realized using the PCB and are permanent in nature. By realizing the electrical connection between the PCB and the memory device chip package, also a mechanical connection is realized. Due to the rugged electrical and mechanical connection between the memory device chip package without any movable part, the memory device chip package can be used in high-vibration environments.

Memory devices in module form factor follow a different approach. The memory device module uses a carrier material, like for example PCB material, which mechanically holds together several different components, which are needed to implement the desired data access mechanisms. The carrier material mechanically fixes the different components, keeps them together and often realizes the electrical interconnections as well. The memory device module is employed in an electrical system of larger scope. Electrical connections between the memory device module and a controller are realized using a pre-defined electro-mechanical connector standard enabling a separable and non-permanent electrical connection. Thereby, the memory device module can be electrically and mechanically separated from the ECU using the connector. By using a pre-defined connector standard, disconnection of the memory device module from the controller and connection of this memory device module to a read-out system for retrieving data is easily possible.

Both variants of non-volatile memory devices have some inherent limitations.

Memory devices in chip package form factor can only be accessed from that device, which they are soldered to. Moreover, memory device chip packages can only economically be used when no second physical entity may require to read from or write to the memory device. This is due to the high effort that is required to remove the memory device chip package from the original system by desoldering, and to insert it into another, identical or different system by resoldering. Thereby, removal of the memory device chip package is only possible using specialized equipment, like reflow ovens, hot air tools and the like, if the function of the memory device chip package needs to be kept. Removal of a memory device chip package is therefore often costly and a time-consuming process. Additionally, specialized readout circuitry is needed to access the data of the memory device chip package.

Memory devices in module form factor on the other hand suffer from inherent problems of electro-mechanical connections. In an environment with vibrations, springy metal contacts that make contact to their mating counterparts within a plug-socket part of a connector may vibrate, causing intermittent electrical connections. This constitutes a fundamental issue of all electro-mechanical separable connections and therefore cannot be solved by different contact forms or arrangements. These spring-loaded metal tabs or tongues will move and vibrate once agitated by external periodic movement, especially at their eigenmode. Movement of these metal tabs causes minimal breakups of the electrical connection, rendering the entire connection apparatus unusable for high power due to micro arcing or high speed signals due to missed bits or spurious extra level changes.

Accordingly, there is a need for an electronic control unit comprising a controller a memory device which is very vibration-resilient to be used in high-vibration environments and which is easily removable from the controller to be accessible for a read-out of data stored in the memory device.

SUMMARY

The present disclosure provides an electronic control unit according to the independent claims. Embodiments are given in the subclaims, the description and the drawings.

The present disclosure is directed at an electronic control unit comprising at least one controller and at least one memory device, wherein the controller comprises at least one electronic component mounted on a main circuit board, the memory device comprises at least one electronic component mounted on an embedded circuit board, the electronic components of the controller and the memory device are connected by conductive paths, the embedded circuit board is formed in one piece with the main circuit board, a predetermined separation line is provided for separating the embedded circuit board from the main circuit board, the embedded circuit board comprises a plurality of pads arranged in a pad array and electrically connected with the conductive paths, and the pads are arranged along a portion of the predetermined separation line to be freely accessible for a read-out of the memory device after a separation of the embedded circuit board and the main circuit board.

As the embedded circuit board is formed in one piece with the main circuit board, the electronic control unit forms a rugged and robust structure having a high resilience against vibrations. The electronic control unit can therefore be used in high vibration environments without being prone to damage of the electronic components and their interconnecting conductive paths, resulting in an excellent reliability of the electronic control unit also in demanding mounting environments. The electronic control unit can be any control unit or electronic apparatus in automotive or other applications.

During nominal operation of the electronic control unit, the memory device can be accessed from the controller only. Thereby, the memory device can be accessed by the controller like a chip package memory device would be accessed. A connection between the controller and the memory device is established by conductive paths which are formed on the main circuit board and the embedded circuit board. The conductive paths can also be distributed within the main circuit board and the embedded circuit board between the respective top and bottom surfaces. The main circuit board and the embedded circuit board can be printed circuit boards.

If read-out of data is desired, the memory device can be easily removed from the electronic control unit by separating the embedded circuit board from the main circuit board at the predetermined separation line. After separation, the pad array, extending in parallel with a portion of the predetermined separation line, is freely accessible and can be connected with common read-out devices to get access to data stored in the memory device. The embedded circuit board mechanically fixes the electronic components of the memory device. In other words, after separation, a standard-memory device module is obtained which can easily be installed into common read-out devices.

As a separation at the predetermined separation line ensures a save and non-damaging removal of the memory device, leaving its conductive paths intact, no special precautionary measures have to be taken during an extraction of the memory device, enabling a time-efficient removal of the memory chip.

The disclosed electronic control unit therefore is both very vibration-resilient and the electronic component is easily extractable for read-out purposes. While the proposed ruggedized integration of a memory device into a larger electrical system is disclosed here as an improvement for automotive electronic control units, it is a concept of larger scope. There are many possible application areas that suffer from high vibrations, like for example large construction vehicles or industrial machinery. There, non-permanent electro-mechanical connections can be used only sparingly. Also electrical modules in hazardous areas suffer from the same challenges. In these cases, a reduction of the necessary connectors using the proposed integration concept may be advantageous. The disclosed integration concept may also be advantageous for reducing the volume of an electrical system, as electrical connectors may be removed and the height of the electrical system may be reduced.

According to an embodiment, material at the predetermined separation line has been at least partly removed. Due to the previous removal of material at the predetermined separation line, less material has to be removed during a separation of the main circuit board and the embedded circuit board. Therefore, separation is further simplified and can be carried out more time efficiently.

According to an embodiment, material at the predetermined separation line has been at least partly removed, leaving breakaway tabs or bridges between the main circuit board and the embedded circuit board for facilitating a separation of the main circuit board and the embedded circuit board. The breakaway tabs or bridges can be formed at regular or irregular distances along a complete length of the predetermined separation line or along only a part thereof. Thereby, size and stiffness of the breakaway tabs or bridges can be adapted to expected vibration forces at the mounting location of the electronic control unit. During separation, the breakaway tabs or bridges can be easily broken or severed by appropriate means, thereby separating the embedded circuit board from the main circuit board.

According to an embodiment, material at the predetermined separation line has been completely removed along at least a part of the predetermined separation line by cutting or milling through the main circuit board and/or the embedded circuit board. In other words, along at least a part of the predetermined separation line the electronic control unit can comprise gaps between the main circuit board and/or the embedded circuit board.

According to an embodiment, material at the predetermined separation line has been at least partly removed by forming a groove for facilitating a separation of the main circuit board and the embedded circuit board. The grooves can be formed along the complete length of the predetermined separation line or along only a part thereof. The grooves can show profiles of constant or decreasing cross-section width and can for example be V-shaped or U-shaped.

According to an embodiment, the groove is formed on a top surface and/or on a bottom surface of the main circuit board and/or the embedded circuit board. With grooves being formed on the top and the bottom surface of the main and embedded circuit boards, bridges are formed along parts of the predetermined separation line where material has been removed. A thickness or vertical extension of these bridges between the top and bottom surface of the circuit boards can be adapted to expected vibration forces at the mounting location of the electronic control unit. If a read-out is desired, the memory device can be removed easily from the electronic control unit, for example by using a cutting tool for cutting through the vertical bridges. For example, a knife or a small and cheap rotary tool can be sufficient to separate the embedded circuit board from the main circuit board.

According to an embodiment, the predetermined separation line is visually marked, in particular by printing, for guiding a cutting tool for separating the main circuit board from the embedded circuit board. Visual marks can be formed along the complete length of the predetermined separation line or along only a part thereof, for example by printing or by applying silk screening to the circuit boards. Also in this case a simple low-cost cutting tool like a knife or a small and cheap rotary tool can be sufficient to separate the embedded circuit board from the main circuit board.

According to an embodiment, material has been removed along the portion of the predetermined separation line adjacent to the pad array only and visual marking is applied to the remaining predetermined separation line. The portion of the predetermined separation line adjacent to the pad array can for example be provided with grooves, breakaway tabs or bridges. Due to material being removed, a separation along this portion can be carried out more easily and more precisely along a straight line. This reduces the risk of damaging the pad array during separation and yields accurate separation edges in regions adjacent to the pad array. Depending on the circumstances and the mounting environment, visual marking along the remaining portion of the predetermined separation may be sufficient for an easy and time-efficient separation of the memory device from the electronic control unit.

According to an embodiment, material has been removed along the portion of the predetermined separation line adjacent to the pad array only and a groove has been formed along the remaining predetermined separation line. The portion of the predetermined separation line adjacent to the pad array can for example be provided with grooves, breakaway tabs or bridges.

According to an embodiment, the pad array is adapted for insertion in a standardized electro-mechanical connector. This means that after separation the memory device can easily be installed into standard read-out devices without the need for dedicated adapter or other additional circuits. After separation, the memory device can be used immediately with a standard read-out device for getting access to the data.

In a further aspect, the present disclosure is directed at an electronic apparatus comprising at least one controller and at least one memory device, wherein the controller comprises at least one electronic component mounted on a main circuit board, the memory device comprises at least one electronic component mounted on an embedded circuit board, the electronic components of the controller and the memory device are connected by conductive paths, the embedded circuit board is formed in one piece with the main circuit board, a predetermined separation line is provided for separating the embedded circuit board from the main circuit board, the embedded circuit board comprises a plurality of pads arranged in a pad array and electrically connected with the conductive paths, and the pads are arranged along a portion of the predetermined separation line to be freely accessible for a read-out of the memory device after a separation of the embedded circuit board and the main circuit board.

Embodiments of the electronic apparatus may comprise the following features:

According to an embodiment, material at the predetermined separation line has been at least partly removed.

According to an embodiment, material at the predetermined separation line has been at least partly removed, leaving breakaway tabs or bridges between the main circuit board and the embedded circuit board for facilitating a separation of the main circuit board and the embedded circuit board.

According to an embodiment, material at the predetermined separation line has been completely removed along at least a part of the predetermined separation line by cutting or milling through the main circuit board and the embedded circuit board.

According to an embodiment, material at the predetermined separation line has been at least partly removed by forming a groove for facilitating a separation of the main circuit board and the embedded circuit board.

According to an embodiment, the groove is formed on a top surface and/or on a bottom surface of the main circuit board and/or the embedded circuit board.

According to an embodiment, the predetermined separation line is visually marked, in particular by printing, for guiding a cutting tool for separating the main circuit board from the embedded circuit board.

According to an embodiment, material has been removed along the portion of the predetermined separation line adjacent to the pad array only and visual marking is applied to the remaining predetermined separation line.

According to an embodiment, material has been removed along the portion of the predetermined separation line adjacent to the pad array only and a groove has been formed along the remaining predetermined separation line.

According to an embodiment, the pad array is adapted for insertion in a standardized electro-mechanical connector.

BRIEF DESCRIPTION OF THE DRAWINGS

Exemplary embodiments and functions of the present disclosure are described herein in conjunction with the following drawings, showing schematically:

FIG. 1A a perspective view of a first embodiment of an electronic control unit;

FIG. 1B a cross-section of the embodiment of FIG. 1A along the line A-A;

FIG. 2A a perspective view of a second embodiment of an electronic control unit;

FIG. 2B a cross-section of the embodiment of FIG. 2A along the line B-B;

FIG. 3A a perspective view of a third embodiment of an electronic control unit;

FIG. 3B a cross-section of the embodiment of FIG. 3A along the line C-C.

DETAILED DESCRIPTION

FIGS. 1A and 1B depict a first embodiment of an electronic control unit 10 in a perspective view (FIG. 1A) and a cross-section along the line A-A of FIG. 1A (FIG. 1B). The electronic control unit 10 comprises a controller 12 and a memory device 14. The controller 12 comprises a plurality of electronic components 16 mounted on a main circuit board 18. The memory device 14 comprises a plurality of electronic components 20 mounted on an embedded circuit board 22. Conductive paths 24 connect the electronic components 16 of the controller 12 and the electronic components 20 of the memory device 14.

The embedded circuit board 22 is formed in one piece with the main circuit board 18, forming a rugged structure which can be used in high-vibration environments. For separating the embedded circuit board 22 from the main circuit board 18, the electronic circuit unit 10 is provided with a predetermined separation line 26 at which material is at least partly removed to facilitate a separation of the main circuit board 18 and the embedded circuit board 22. In this embodiment, the predetermined separation line 26 forms a rectangle, depicting an outline of the memory device 14 of the electronic control unit 10.

The embedded circuit board 22 comprises a plurality of pads 28 which are arranged in a linear pad array 30 and are electrically connected with the conductive paths 24. The pads 28 are arranged along a straight side line of the rectangular predetermined separation line 26. After a separation of the embedded circuit board 22 and the main circuit board 18 the pads 28 are freely accessible at an outer edge of the separated circuit board 22 for a read-out of the memory device 14.

In the embodiment of FIGS. 1A and 1B, material at the predetermined separation line 26 has been completely removed along a part of the predetermined separation line 26 by cutting or milling through the main circuit board 12 and/or the embedded circuit board 14, for facilitating a separation of the main circuit board and the embedded circuit board 14. By this complete removal of material slits 32 or gaps 32 have been formed between the main circuit board 12 and the embedded circuit 14 board along a part of the predetermined separation line 26. The gaps 32 alternate with breakaway tabs or bridges 34 which are provided at portions of the predetermined separation line 26 where material has not been removed.

During nominal operation of the electronic control unit 10, the memory device 14 can be accessed from the controller 12 only. Due to the rugged electrical and mechanical connection between the main circuit board 18 and the embedded circuit board 22 the electronic control unit 10 is very vibration-resilient and can be used in high-vibration environments.

If a read-out of data is desired, the memory device 14 can be easily removed from the electronic control unit 10 by separating the embedded circuit board 22 from the main circuit board 18 at the predetermined separation line 26. For separation, the breakaway tabs 34 or bridges 34 can be easily broken or severed by appropriate means, for example by a knife or a rotary cutting tool, thereby separating the embedded circuit board 22 from the main circuit board 18. After separation, the pad array 30, extending in parallel with a side of the rectangular predetermined separation line 26, is freely accessible and can be connected with common read-out devices using standard plug-in connectors to get access to data stored in the memory device 14.

FIGS. 2A and 2B depict a second embodiment of an electronic control unit 10 in a perspective view (FIG. 2A) and a cross-section along the line B-B of FIG. 2A (FIG. 2B). The second embodiment differs from the embodiment of FIGS. 1A and 1B by the formation of separation facilitating means along the predetermined separation line 26. Instead of slits or gaps 32 and breakaway tabs 34 or bridges 34 grooves 36 have been formed along the three sides of the rectangular predetermined separation line 26 which are not located adjacent to the pad array 30. The grooves 36 are e.g. V-shaped and are formed on both the top surfaces 18a, 22a and bottom surfaces 18b, 22b of the main circuit board 18 and the embedded circuit board 22. In other embodiments not shown here, a groove 36 can also be formed only on the top surfaces 18a, 22a or the bottom surfaces 18b, 22b of the main circuit board 18 and the embedded circuit board 22. The side of the rectangular predetermined separation line 26 adjacent to the pad array 30 is provided with gaps 32 and breakaway tabs 34 or bridges 34 which allow a more precise and accurate separation of the embedded circuit board 22 from the main circuit board 18 in the vicinity of the pad array 30 along a straight line.

FIGS. 3A and 3B depict a third embodiment of an electronic control unit 10 in a perspective view (FIG. 3A) and a cross-section along the line C-C of FIG. 3A (FIG. 3B). The third embodiment differs from the previous embodiments of FIGS. 1A to 2B by the formation of separation facilitating means along the predetermined separation line 26. Instead of gaps 32, breakaway tabs 34, bridges 34 or grooves 36, the three sides of the rectangular predetermined separation line 26 which are not located adjacent to the pad array 30 have been visually marked, for example by printing. If a read-out is desired, the memory device 14 can be removed easily from the electronic control unit 10, for example by using a cutting tool for cutting through the main circuit board 18 and/or the embedded circuit board 22 along the visually marked predetermined separation line 26. The side of the rectangular predetermined separation line 26 adjacent to the pad array 30 is provided with gaps 32 and breakaway tabs 34 or bridges 34 allowing a more precise and accurate separation of the embedded circuit board 22 from the main circuit board 18 in the vicinity of the pad array 30 along a straight line.

In other embodiments not shown here, the separation facilitating means like slits or gaps 32, breakaway tabs 34 or bridges 34, grooves 36 or visual marks along the predetermined separation line 26 can be combined differently than in the embodiments of FIGS. 1A to 3B. Thereby, all combinations of separation facilitating means are conceivable. For example, instead of slits 32 or gaps 32 and breakaway tabs 34 or bridges 34, the side of the rectangular predetermined separation line 26 adjacent to the pad array 30 can be provided with a groove 36, while the three sides of the rectangular predetermined separation line 26 which are not located adjacent to the pad array 30 can be visually marked only.

What is claimed is:

1. An electronic control unit comprising at least one controller and at least one memory device, wherein:
    the controller comprises at least one electronic component mounted on a main circuit board,
    the memory device comprises at least one electronic component mounted on an embedded circuit board,
    the electronic components of the controller and the memory device are connected by conductive paths,
    the embedded circuit board is formed in one piece with the main circuit board,
    a predetermined separation line is provided for separating the embedded circuit board from the main circuit board,
    the embedded circuit board comprises a plurality of pads arranged in a pad array and electrically connected with the conductive paths, and
    the pads are arranged along a portion of the predetermined separation line to be freely accessible for a read-out of the memory device after a separation of the embedded circuit board and the main circuit board.

2. The electronic control unit according to claim 1, wherein material at the predetermined separation line has been at least partly removed.

3. The electronic control unit according to claim 2, wherein material at the predetermined separation line has been at least partly removed, leaving breakaway tabs or bridges between the main circuit board and the embedded circuit board for facilitating a separation of the main circuit board and the embedded circuit board.

4. The electronic control unit according to claim 2, wherein material at the predetermined separation line has been completely removed along at least a part of the predetermined separation line by cutting or milling through the main circuit board and the embedded circuit board.

5. The electronic control unit according to claim 2, wherein material at the predetermined separation line has been at least partly removed by forming a groove for facilitating a separation of the main circuit board and the embedded circuit board.

6. The electronic control unit according to claim 5,
    wherein the groove is formed on a surface of the main circuit board.

7. The electronic control unit according to claim 5,
    wherein the groove is formed on a surface of the embedded circuit board.

8. The electronic control unit according to claim 5,
    wherein the groove is formed on a top surface of the main circuit board and a bottom surface of the embedded circuit board.

9. The electronic control unit according to claim 5,
    wherein the groove is formed on a top surface of the embedded circuit board and a bottom surface of the main circuit board.

10. The electronic control unit according to claim 5, wherein material has been removed along the portion of the predetermined separation line adjacent to the pad array only and wherein a groove has been formed along the remaining predetermined separation line.

11. The electronic control unit according to claim 1, wherein the predetermined separation line is visually marked, in particular by printing, for guiding a cutting tool for separating the main circuit board from the embedded circuit board.

12. The electronic control unit according to claim 11, wherein material has been removed along the portion of the predetermined separation line adjacent to the pad array only and wherein visual marking is applied to the remaining predetermined separation line.

13. The electronic control unit according to claim 1, wherein the pad array is adapted for insertion in a standardized electromechanical connector.

14. A system comprising:
a main circuit board comprising at least one electronic component mounted on the main circuit board;
an embedded circuit board formed as one piece with the main circuit board, the one piece comprising a predetermined separation line for separating the embedded circuit board from the main circuit board, the embedded circuit board comprising:
- at least one electronic component mounted on the embedded circuit board; and
- a plurality of pads arranged in a pad array along a portion of the predetermined separation line to be freely accessible for a read-out of the system after a separation of the embedded circuit board and the main circuit board; and conductive paths that electrically connect the at least one electronic component mounted on the main circuit board via the pad array to the at least one electronic component mounted on the embedded circuit board.

15. The system of claim 14, further comprising:
a controller comprising the at least one electronic component mounted on the main circuit board.

16. The system of claim 14, further comprising:
a memory device comprising the at least one electronic component mounted on the embedded circuit board.

17. The system of claim 14, wherein material at the predetermined separation line has been completely removed along at least a part of the predetermined separation line.

18. The system of claim 14, wherein material at the predetermined separation line has been at least partly removed.

19. The system of claim 14, wherein the predetermined separation line forms a groove for facilitating a separation of the main circuit board and the embedded circuit board.

20. The system of claim 19,
wherein a top surface of the main circuit board forms the groove between a bottom surface of the embedded circuit board; or
wherein a bottom surface of the main circuit board forms the groove between a top surface of the embedded circuit board.

* * * * *